(12) United States Patent
Yoda

(10) Patent No.: US 9,214,446 B2
(45) Date of Patent: Dec. 15, 2015

(54) METHOD OF MANUFACTURING OPTICAL MODULE

(75) Inventor: Kaoru Yoda, Nagano (JP)

(73) Assignee: CITIZEN HOLDINGS CO., LTD., Tokyo (JP)

( * ) Notice: Subject to any disclaimer, the term of this patent is extended or adjusted under 35 U.S.C. 154(b) by 667 days.

(21) Appl. No.: 13/422,656

(22) Filed: Mar. 16, 2012

(65) Prior Publication Data

US 2012/0234458 A1  Sep. 20, 2012

(30) Foreign Application Priority Data

Mar. 18, 2011  (JP) ................. 2011-060916

(51) Int. Cl.
*B29C 65/00* (2006.01)
*H01L 23/00* (2006.01)

(52) U.S. Cl.
CPC .............. *H01L 24/83* (2013.01); *H01L 24/32* (2013.01); *H01L 2224/29019* (2013.01); *H01L 2224/2919* (2013.01); *H01L 2224/29111* (2013.01); *H01L 2224/32059* (2013.01); *H01L 2224/32238* (2013.01); *H01L 2224/7592* (2013.01); *H01L 2224/81192* (2013.01); *H01L 2224/81444* (2013.01); *H01L 2224/81895* (2013.01); *H01L 2224/83099* (2013.01); *H01L 2224/83193* (2013.01); *H01L 2224/83208* (2013.01); *H01L 2224/83385* (2013.01); *H01L 2224/83444* (2013.01); *H01L 2224/83895* (2013.01); *H01L 2924/014* (2013.01); *H01L 2924/01005* (2013.01); *H01L 2924/01006* (2013.01); *H01L 2924/01023* (2013.01);
(Continued)

(58) Field of Classification Search
CPC ...... B29C 66/92; B29C 66/924; B29C 66/95; B29C 66/952; Y10T 156/1039; H01L 2224/29111; H01L 2924/01079; H01L 2924/00014; H01L 2224/2919; H01L 2924/0132; H01L 2924/0105
USPC .......... 156/64, 219, 295, 358; 385/80; 438/31
See application file for complete search history.

(56) References Cited

U.S. PATENT DOCUMENTS 5,700,987 A    12/1997  Basavanhally
2008/0245843 A1*  10/2008  Suga et al. ............... 228/3.1

FOREIGN PATENT DOCUMENTS

JP    10-208269    8/1998
JP    2001-189339  7/2001
(Continued)

OTHER PUBLICATIONS

Translation of JP 2001-189339, Fujitsu Ltd, Kainuma Norio et al, Jul. 10, 2001.*

(Continued)

*Primary Examiner* — George Koch
(74) *Attorney, Agent, or Firm* — Finnegan, Henderson, Farabow, Garrett & Dunner, L.L.P.

(57) ABSTRACT

The present invention is directed to provide a method of manufacturing an optical module in which optical devices are optically aligned with high precision regardless of elastic return of bonding bumps. The invention provides a method of manufacturing an optical module including the steps of forming bumps for bonding made of metal on a substrate, and bonding a second optical device on the bonding bumps by applying a load so that the bumps for bonding are deformed only by a predetermined amount from a position where a first optical device and the second optical device are optically coupled most efficiently and, after that, releasing the load.

4 Claims, 14 Drawing Sheets

(52) U.S. Cl.
CPC ............ *H01L 2924/01029* (2013.01); *H01L 2924/0132* (2013.01); *H01L 2924/01033* (2013.01); *H01L 2924/01075* (2013.01); *H01L 2924/01079* (2013.01); *Y10T 156/1039* (2015.01)

(56) References Cited

FOREIGN PATENT DOCUMENTS

| | | | |
|---|---|---|---|
| JP | 2001189339 A | * | 7/2001 |
| JP | 2002-111113 | | 4/2002 |
| JP | 2005-311298 | | 11/2005 |
| JP | 2007-133011 | | 5/2007 |

OTHER PUBLICATIONS

Translation of JP 2007-133011, published May 31, 2007, first Inventor Shimizu Takanori, Applicant NEC Corporation, original document previously submitted by IDS.*
European Search Report and Annex dated Jun. 19, 2012 issued in EP 12 159 734.8.
Chang, Shyh-Ming et al., "Internal Stress and Connection Resistance Correlation Study of Microbump Bonding," IEEE, vol. 24, No. 3, Sep. 2001. pp. 493-499.
Office Action for JP Patent Application No. 2011-060916 mailed Jul. 1, 2014.
Office Action for Counterpart CN Application No. 201210070077.7 mailed Jun. 3, 2015.

* cited by examiner

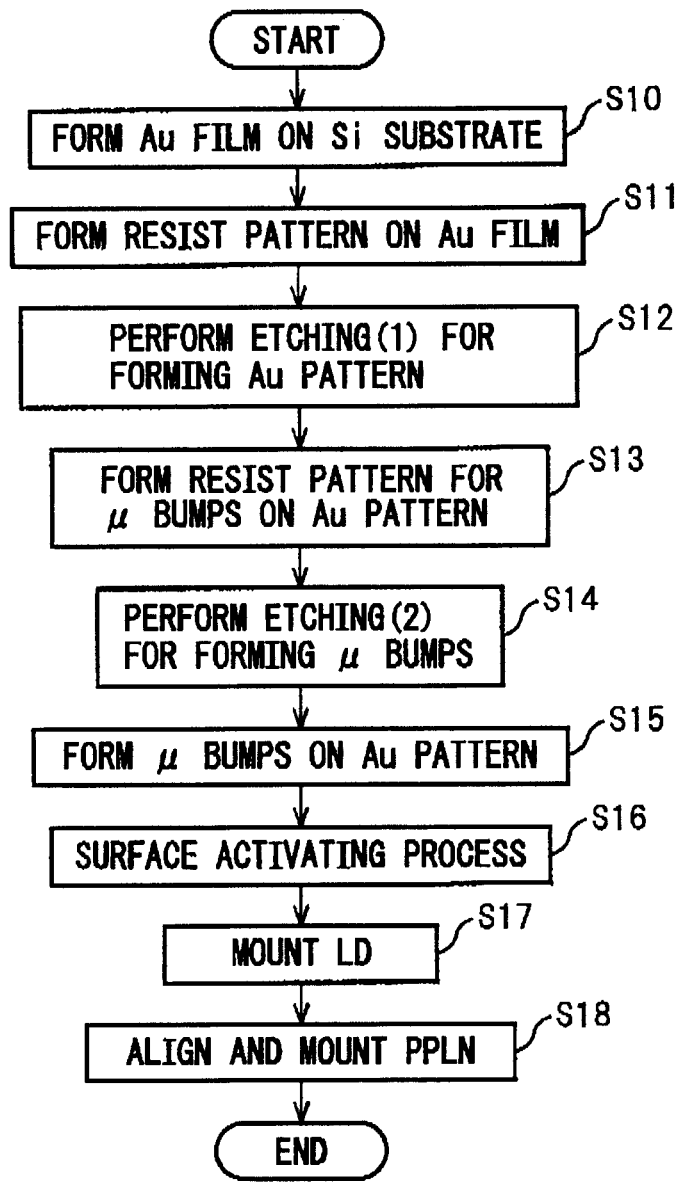

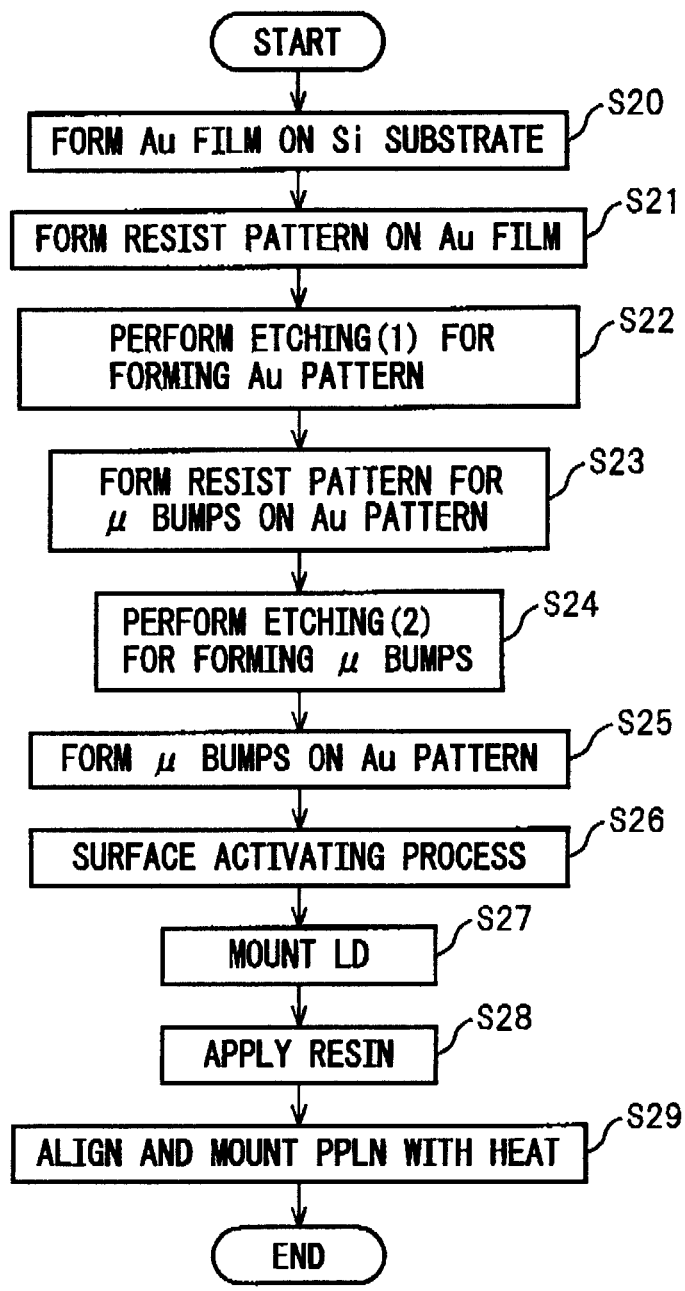

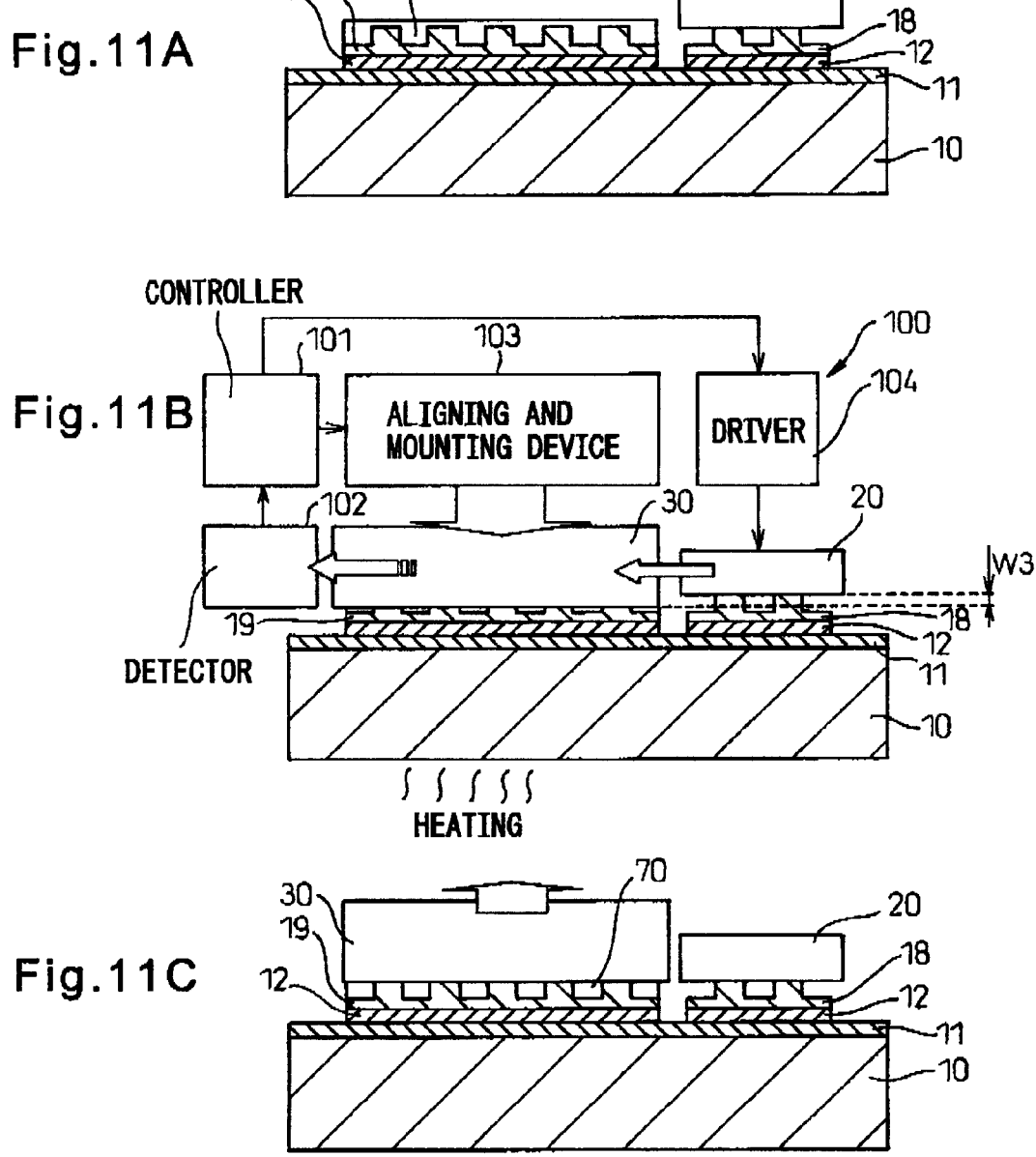

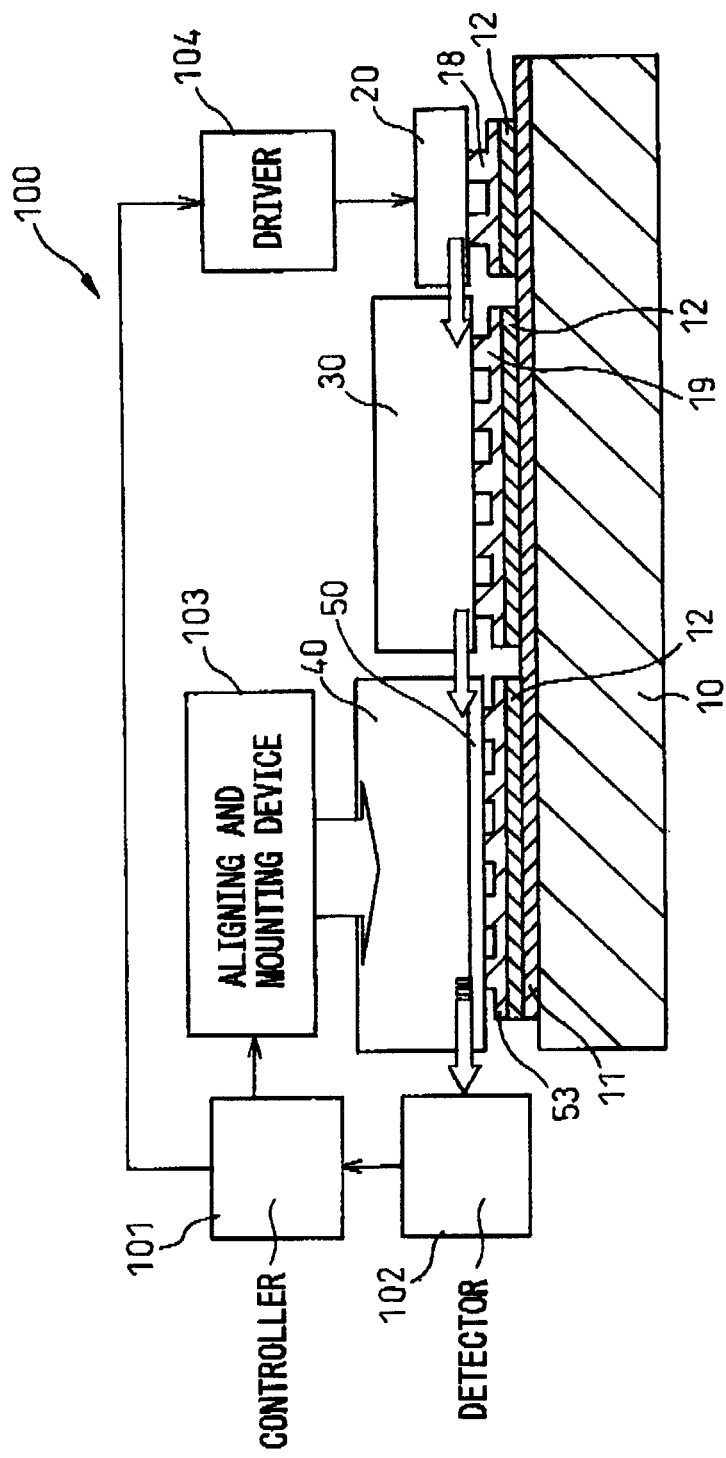

METHOD OF MANUFACTURING OPTICAL MODULE

The entire content of Japanese Patent Application No. 2011-060916 is hereby incorporated by reference.

FIELD OF THE INVENTION

The present invention relates to a method of manufacturing an optical module and, more specifically, to a method of manufacturing an optical module including a plurality of optical devices bonded by using bonding bumps.

BACKGROUND OF THE INVENTION

A method of mounting a semiconductor laser element, and joining a photodiode to a copper heat sink using bonding bumps to optically align the semiconductor laser element and the photodiode with high precision is known (for example, refer to Japanese Unexamined Patent Application Publication No. H10-208269 (FIG. 1)).

In the method, in the case of joining the photodiode with the bonding bumps, the relationship between pressure applied to the bonding bumps and height of the bonding bumps deformed according to the applied pressure is examined in advance, and a proper application pressure is selected according to the relationship.

SUMMARY OF THE INVENTION

There is however no technique of positioning in the height direction of an optical device in submicron order by pressing bonding bumps.

When a load is applied to the bonding bumps to deform the bonding bumps and, after that, is released, a force of returning from the deformed position to the original position acts on the deformed bonding bumps by elasticity of the bonding bumps. Even if the optical devices are aligned in a state where the load is applied to the bonding bumps, when the load is released (the applied load is removed), the bonding bumps are deformed again to return to the original state. The relative positions of the optical devices change which is inconvenient.

The re-deformation that the bonding bumps are deformed again to the state before the deformation after the load is released will be called "elastic return of bonding bumps", and the deformation amount will be called "elastic return amount". The "elastic return amount" changes according to the amount of a load applied, the material of the bonding bumps, the shape of the bonding bumps, and the like.

Therefore, an object of the present invention is, to provide a method of manufacturing an optical module to solve the problem.

Another object of the invention is to provide a method of manufacturing an optical module in which optical devices can be optically aligned with high precision regardless of an elastic return of bonding bumps.

A method of manufacturing an optical module according to the present invention includes steps of forming bonding bumps made of metal on a substrate, and bonding a second optical device on the bonding bumps by applying a load so that the bonding bumps are deformed only by a predetermined amount from a position where a first optical device and the second optical device are optically coupled most efficiently and, after that, releasing the load.

According to the present invention, the second optical device is bonded on the bonding bumps based on the elastic return amount of the bonding bumps. Consequently, also in a state in which the load is released, the first and second optical devices can be aligned with high precision.

BRIEF DESCRIPTION OF THE DRAWINGS

FIG. 2 is a flowchart for explaining processes of manufacturing the semiconductor laser module 1.
FIG. 10 is a flowchart for explaining processes of another semiconductor laser module 2.
FIGS. 11A, 11B and 11C are diagrams illustrating processes of manufacturing the another semiconductor laser module 2.
FIG. 14 is a diagram (4) illustrating the process of manufacturing the semiconductor laser module 1.

DETAILED DESCRIPTION OF THE PREFERRED EMBODIMENT

Hereinafter, with reference to the drawings, a method of manufacturing an optical module according to the present disclosure will be described. It should be noted that the technical scope of the present invention is not limited to embodiments of the invention but covers the invention described in the claims and its equivalent.

Figure 1A:
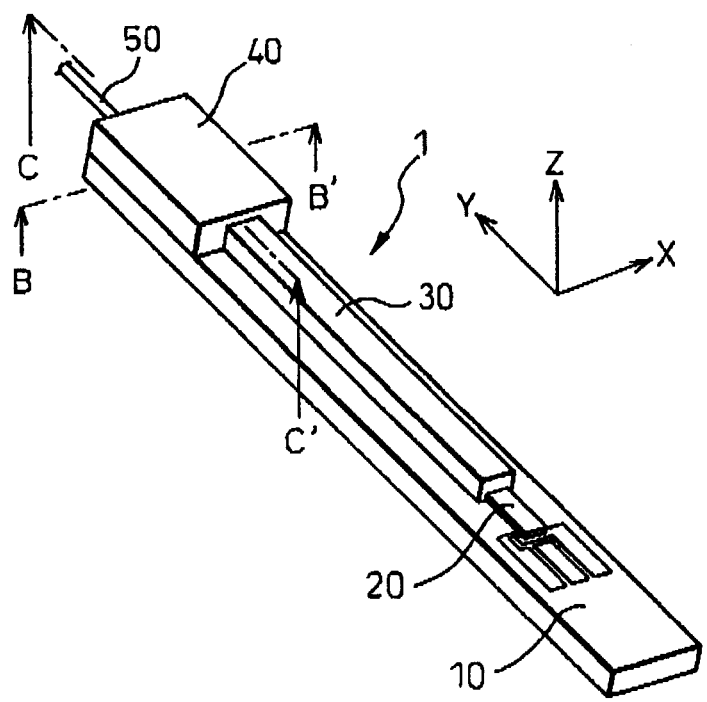
FIGS. 1A and 1B are diagrams illustrating a semiconductor laser module 1.
Figure 1B:
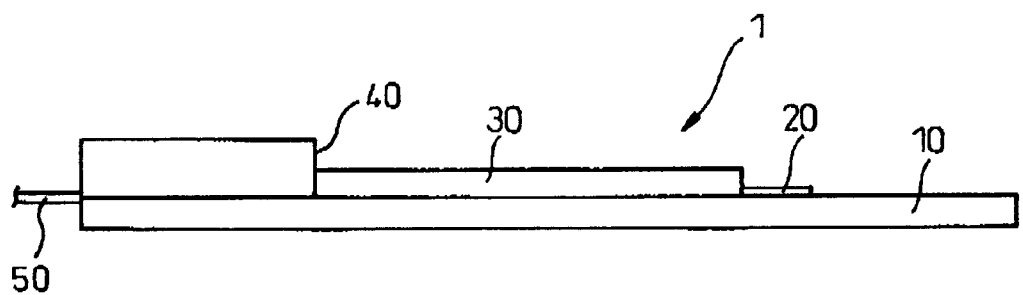

FIG. 1A is a perspective view of a semiconductor laser module 1 as an example of an optical module and FIG. 1B is a side view in the Y-axis direction of the semiconductor laser module 1.

The semiconductor laser module 1 includes a silicon substrate 10, an LD (Laser Diode) element 20, a PPLN (Periodically Poled Lithium Niobate) element 30 for converting the wavelength of light emitted from the LD element 20, a sub-substrate 40 made of silicon or glass, and an optical fiber 50. For example, the semiconductor laser module 1 functions to convert single-mode laser near-infrared light having wavelength of 1,064 nm emitted from the LD element 20 to green laser light having wavelength of 532 nm in the PPLN element 30 and emit the green laser light. The light emitted from the PPLN element 30 is transmitted through the single-mode optical fiber (SMF) 50 bonded to the silicon substrate 10 via the sub-substrate 40.

In the semiconductor laser module 1, elements are optically coupled so that light emitted from the LD element 20 can efficiently enter the PPLN element 30. To increase the optical coupling efficiency, those elements are requested to be aligned at extremely high precision. The positional precision in the plane direction (XY plane) on the silicon substrate 10 in FIG. 1A is adjusted by a mounting device at the time of mounting by providing reference marks such as alignment marks on the silicon substrate 10.

However, normally, with respect to the precision in the height direction (Z direction) in FIG. 1A, without taking any measure, the mounting height is determined by contact points between the silicon substrate 10 and each of the LD element 20 and the PPLN element 30. Consequently, by forming microbumps as bonding bumps which will be described later on the silicon substrate 10 and deforming the microbumps by applying a predetermined load to the microbumps at the time of mounting the PPLN element 30, the precision in the height direction (z direction) is maintained.

In the case of mounting the LD element 20 and the PPLN element 30 on the silicon substrate 10, a bonding material such as resin, AuSn, or solder can be used. Although the position adjustment can be performed by vertically moving the elements during the bonding material is in a liquid form, when the bonding material is cooled and solidified, the bonding material is shrunk and deformed unpredictably. It is consequently difficult with high-precision to adjust the position in the height direction (Z direction).

The semiconductor laser module 1 is an example of the optical module. It is not interpreted that the optical module is limited to the semiconductor laser module 1. The optical module can be preferably applied to other modules each having two or more optical devices optically coupled. For example, as will be described later, the optical module can be used for optical coupling between the LD element 20 and the PPLN element 30 or optical coupling between the PPLN element 30 and the optical fiber 50 fixed to the sub-substrate 40. The optical coupling denotes that the positional relation of optical devices is determined so that light output from one of the optical devices directly enters the other optical device.

With reference to FIG. 2 to FIG. 5C, a part regarding bonding of the LD element 20 and the PLLN element 30, in processes of manufacturing the semiconductor laser module 1 as an example of the optical module will be described. FIG. 2 is a flowchart for explaining processes of manufacturing the semiconductor laser module 1. FIGS. 3A to 3D to FIGS. 5A to 5C are diagrams for more specifically explaining the processes of manufacturing the semiconductor laser module 1 illustrated in FIG. 2.

Figure 3A:
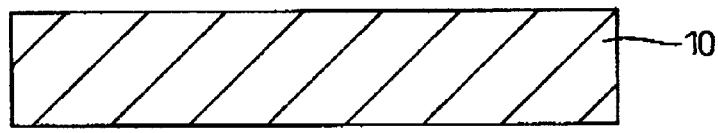
FIGS. 3A, 3B, 3C and 3D are diagrams (1) illustrating processes of manufacturing the semiconductor laser module 1.
Figure 3B:
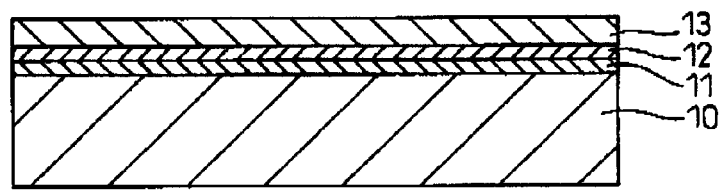

First, the silicon substrate 10 is prepared. FIG. 3A is a cross sectional view of the silicon substrate 10.

Next, the entire silicon substrate 10 is heated in an oxidizing atmosphere and an $SiO_2$ (silicon dioxide) thin film 11 is formed on the silicon substrate 10. A Ti (titanium) thin film 12 is formed on the $SiO_2$ thin film 11 by vapor deposition. Further, an Au layer 13 having a thickness of 3 μm is formed on the Ti thin film 12 by vapor deposition (S10) (refer to FIG. 3B). The Au layer 13 may be formed by, in addition to vapor deposition, sputtering, electrodeposition, or the like. The $SiO_2$ thin film 11 functions as an insulating layer insulating between the silicon substrate 10 and microbumps 18 which will be described later. The Ti thin film 12 is formed to increase adhesion between the $SiO_2$ thin film 11 and the Au layer 13.

Figure 3C:
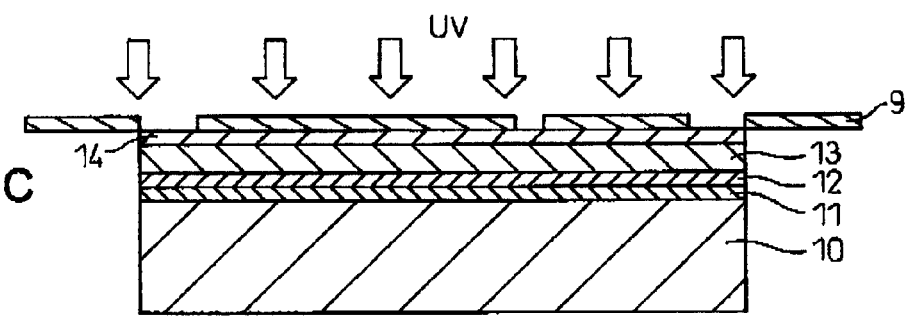

Subsequently, a photoresist layer 14 is formed on the Au layer 13, a mask layer 9 is disposed, and ultraviolet light is applied so that a photoresist 14' corresponding to the mask layer 9 is formed (S11) (refer to FIG. 3C).

Figure 3D:
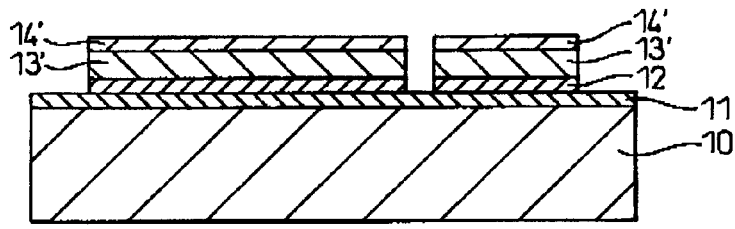

The Au layer 13 and the Ti thin film 12 out of the part in which the photoresist 14' is formed are etched by dry etching to form an Au layer pattern 13' (S12) (refer to FIG. 3D). The Au layer pattern 13' may be formed by wet etching in place of dry etching.

Figure 4A:
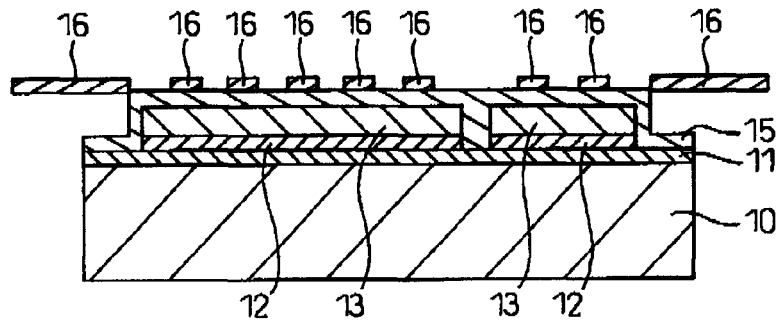
FIGS. 4A, 4B and 4C are diagrams (2) illustrating processes of manufacturing the semiconductor laser module 1.

After removing the photoresist 14', the photoresist layer 15 is formed again, a mask layer 16 is disposed, and ultraviolet light is applied so that a photoresist 15' corresponding to the mask layer 16 is formed (S13) (refer to FIG. 4A).

Figure 4B:
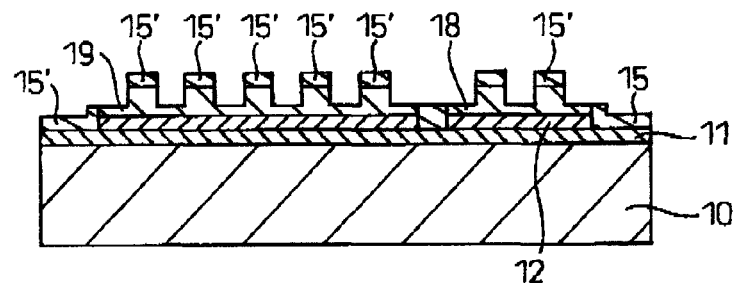

The Au layer pattern 13' out of the part in which the photoresist 15' is formed is half-etched by dry etching to form the microbumps 18 and microbumps 19 (S14) (refer to FIG. 4B). The microbumps 18 and 19 may be formed by wet etching in place of dry etching. The half-etching is etching performed so that the pattern out of the part in which the photoresist 15' is formed is not entirely removed but partially remains. In the embodiment, on the outside of the part in which the photoresist 15' is formed, etching is performed so that the thickness of Au layer pattern 13' is 1 μm.

Subsequently, the photoresist 15' is removed, and formation of the microbumps 18 and 19 on the silicon substrate is completed (S15) (refer to FIG. 4C). The microbumps 18 and 19 as a plurality of columnar projections each having a height of 2 μm and a diameter of 5 μm are disposed at pitches of 10 to 25 μm equally in the horizontal direction. The values of shape, height, width, pitch, and the like of the projection are an example and are not limited to the above-mentioned ones. The microbumps 18 and 19 are based on the Au layer 13 formed by sputtering (S10) and formed by half-etching (S14), so that the heights of all of the projections included in the microbumps 18 and 19 are uniformed with high precision.

By plasma-cleaning an oxide film or an inactive layer such as contamination covering the surface of the microbumps 18 and 19, the surface is activated (S16). Since atoms having high surface energy can be made come into contact with each other by the surface activation, bonding can be firmly performed at room temperature by using adhesion between the atoms. This bonding method does not require special heating and occurrence of a positional deviation of each of the parts caused by residual stress of a thermal expansion coefficient difference is suppressed, so that high-precision alignment and mounting can be performed. The method also has advantages such that destruction of parts caused by the residual stress of a thermal expansion coefficient difference does not easily occur, no stress is applied to the parts, and very little deterioration in functions.

Figure 5A:
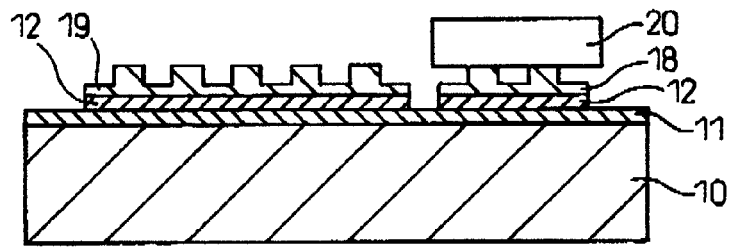
FIGS. 5A, 5B and 5C are diagrams (3) illustrating processes of manufacturing the semiconductor laser module 1.

Next, the LD element 20 is mounted on the surface-activated microbumps 18 (S17) (refer to FIG. 5A). An Au layer is formed also on the bonding face of the LD element 20, and its surface is subjected to activating process. Therefore, only by mounting the LD element 20 on the microbumps 18 and applying a predetermined load, the LD element 20 is surface-activated and bonded to the microbumps 18 and fixed. The LD element 20 can receive supply of drive current via the microbumps 18. In this case, it is sufficient to perform predetermined patterning for supplying drive current on the Au layer pattern 13' for forming the microbumps 18.

The LD element 20 is mounted by a mounting device for attaching not-shown electronic parts on the circuit board. The LD element 20 may be mounted by using an aligning and mounting device 103 used in S18 to be described later.

The PPLN element 30 is aligned and mounted on the surface-activated microbumps 19 (S18) (refer to FIG. 5B), and the series of processes are finished. An Au layer is formed also on the bonding surface of the PPLN element 30, and the surface is subjected to the activating process. Therefore, only by mounting the PPLN element 30 on the microbumps 19 and applying a predetermined load, the PPLN element 30 is surface-activated and bonded on the microbumps 19 and fixed.

The alignment and mounting in S18 is performed by using an aligning and mounting apparatus 100. The aligning and mounting apparatus 100 includes: a controller 101 constructed by, for example, a PC including a CPU, a predetermined memory, and the like; a detector 102 detecting intensity of a wavelength-converted laser beam output from the PPLN element 30 and outputting detection output voltage v (mV) according to the intensity; the aligning and mounting device 103 capable of mounting an electronic part in a predetermined position on the silicon substrate 20 and applying a load (N) according to a control amount at the time of mounting; and a driver 104 driving the LD element 20 to emit a laser beam.

The controller 101 controls the driver 104 to drive the LD element 20 and make the laser beam enter the PPLN element 30, and the intensity of the wavelength-converted laser beam emitted from the PPLN element 30 is detected by the detector 102. Further, the controller 101 controls the aligning and mounting device 103 while monitoring output voltage V detected by the detector 102 to control the load applied to the PPLN element 30.

Figure 6:
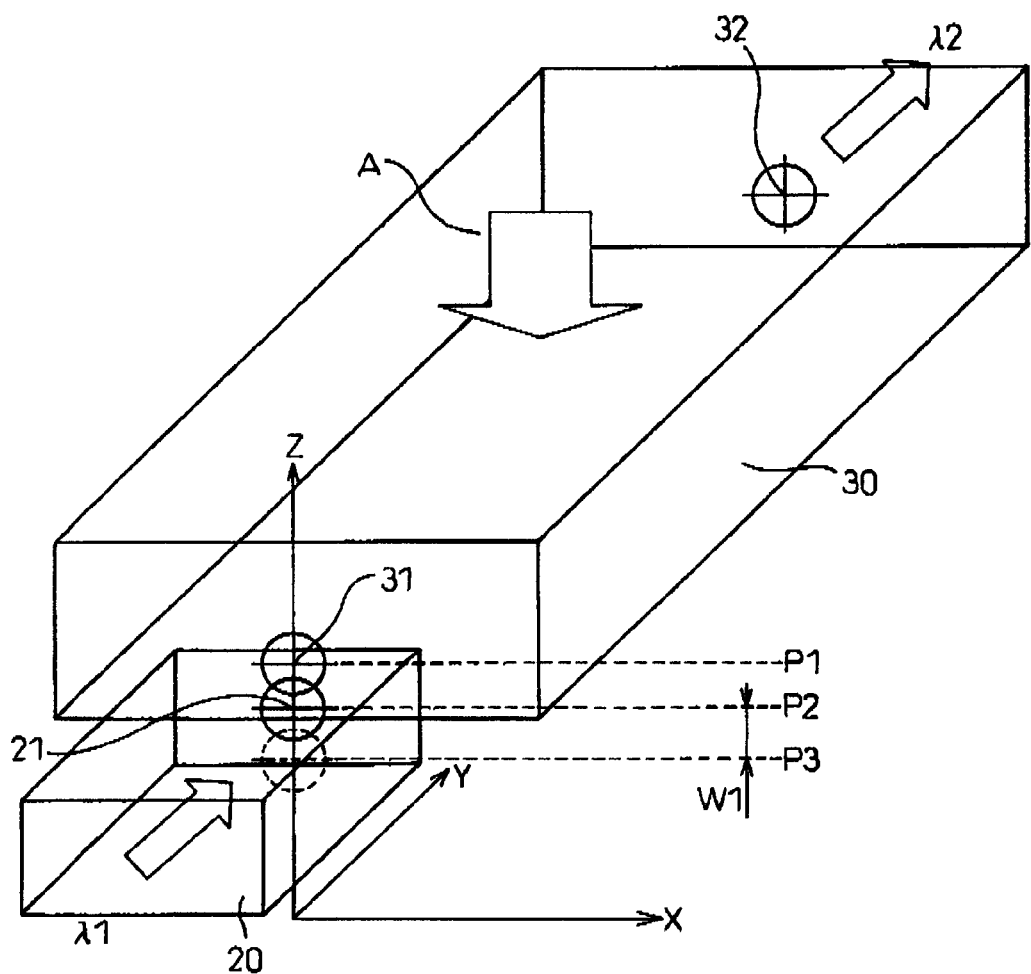
FIG. 6 is a diagram illustrating the positional relation between an LD element 20 and a PPLN element 30.

FIG. 6 is a diagram illustrating the positional relation between the LD element 20 and the PPLN element 30.

A laser beam having a wavelength λ1 emitted from a light emission center 21 of the LD element 20 enters an incident position 31 in the PPLN element 30 and goes out as a laser beam having a wavelength λ2 from an outgoing center 32 of the PPLN element 30. As shown in FIG. 6, the LD element 20 and the PPLN element 30 are mounted on the silicon substrate 10 by the aligning and mounting device 103, the positional relation in the plane (the positional relation in the X-Y axis direction) between the light emission center 21 of the LD element 20 and the incident position 31 in the PPLN element 30 is determined with high precision. However, the positional relation in the height direction (Z-axis direction) of the silicon substrate 10 has to be determined with high precision. In FIG. 6, the arrow A shows a direction in which a load is applied to the PPLN element 30 by the aligning and mounting device 103.

Figure 7:
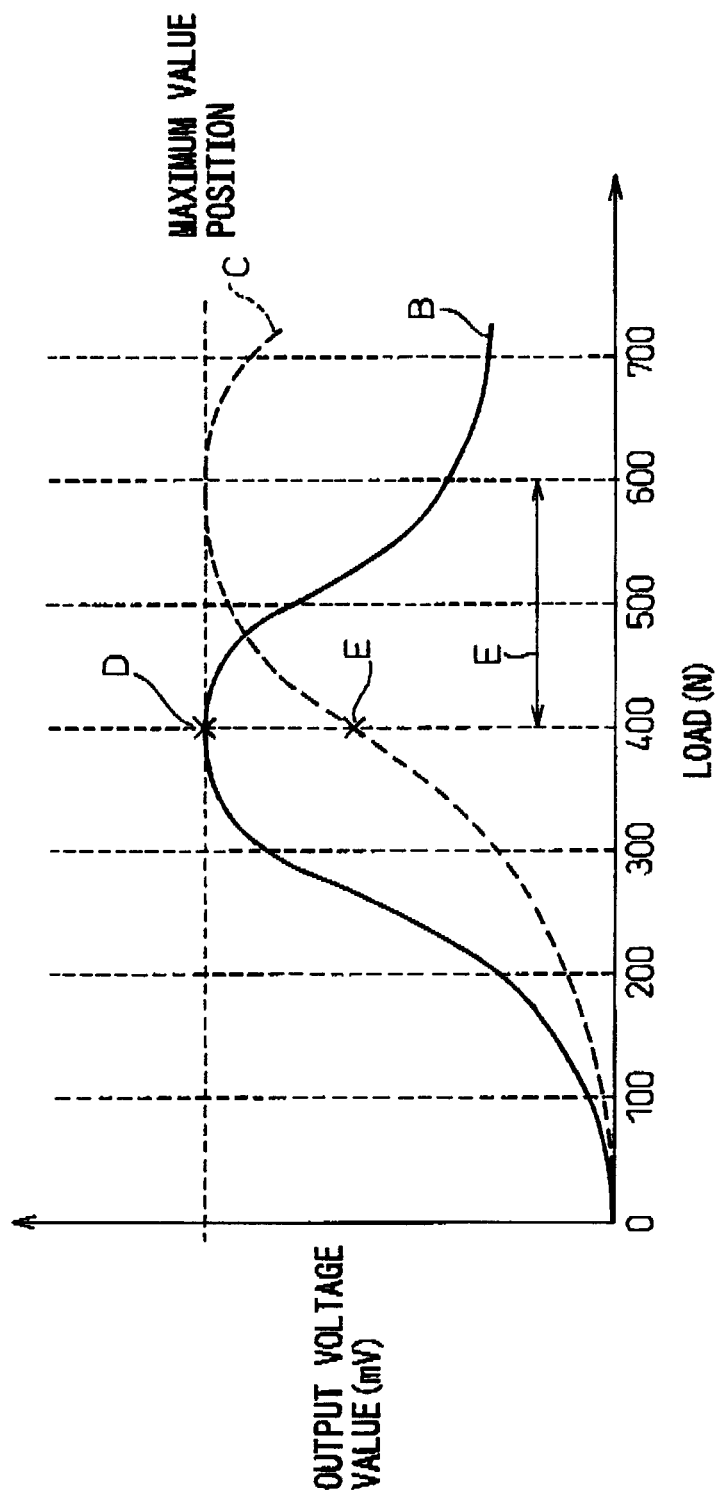
FIG. 7 is a graph showing the relation between output voltage of a detector 102 and a load applied by an aligning and mounting device 103.

FIG. 7 is a graph showing the relation between output voltage of the detector 102 and a load applied by the aligning and mounting device 103.

In FIG. 7, the curve B indicates the relation between output voltage (mV) of the detector 102 and the load (N) applied by the aligning and mounting device 103 in a state where the load is applied. The curve C indicates the relationship between the output voltage (mV) of the detector 102 and the final load (N) applied by the aligning and mounting device 103 after the load is released. In the example of FIG. 7, in the state where the load is applied, in the case where the load is 400 (N), the output voltage (mV) of the detector 102 becomes the maximum value (refer to point D). However, after the load is released, in the case where the final load is 400 (N), the output voltage (mV) of the detector 102 does not become the maximum value (refer to point E).

The point D corresponds to the case where the microbumps 19 are deformed by applying a load to the PPLN element 30 to set the incident position 31 of the PPLN element 30 to a position (refer to the position P2 in FIG. 6) in which the incident position 31 is most-efficiently optically coupled to the light emission center 21 of the LD element 20 and, in this state, the load is released. The microbumps 19 have a characteristic such that when the load is applied, the microbumps 19 are deformed (pressed) and shrunk. When the load is released by elastic rebound, the force of returning to the original state works, and the microbumps 19 return to the original state only by the elastic return amount. That is, the point E corresponds to the case where when the load is released in the state of the point D, the incident position 31 of the PPLN element 30 moves to another position (for example, refer to the position P1 in FIG. 6) by the elastic return.

In the state where the load is released (state where the semiconductor laser module 1 is actually used), the incident position 31 of the PPLN element 30 has to be set to the position (refer to the position P2 in FIG. 6) in which the incident position 31 is most-efficiently and optically coupled to the light emission center 21 of the LD element 20. Consequently, in the aligning and mounting in S18, the controller 101 controls the aligning and mounting device 103 as follows. The PPLN element 30 is disposed in the predetermined position of the microbumps 19. While increasing the load applied, after the output voltage V from the detector 102 becomes the maximum value, a predetermined load amount is applied to further deform the microbumps 19 and, then, the load is released.

Specifically, after the output voltage V from the detector 102 becomes the maximum value (refer to the point D), the controller 101 further applies a predetermined load amount (F: 200(N)) and, after that, the load is released. The predetermined load F is further applied so that the incident position 31 of the PPLN element 30 is pushed into a position (refer to the position P3 in FIG. 6) deeply pushed from the light emission center 21 of the LD element 20 only by the distance W1 shown in FIG. 6. After that, by releasing the load, the incident position 31 of the PPLN element 30 returns to the position where it is most-efficiently optically coupled to the light emission center 21 of the LD element 20 (refer to P2 in FIG. 6) by elastic return (refer to FIG. 5C).

The above-described predetermined load amount (F: 200 (N)) varies depending on the shape of the aligning and mounting device 103 and the PPLN element 30 to which the load is applied, the material and the shape of the microbumps 19, and the like. It can be calculated by conducting an experiment to obtain the curves B and C shown in FIG. 7. In the aligning and mounting in S18, after the output voltage V from the detector 102 becomes the maximum value, the controller 101 controls the aligning and mounting device 103 so as to apply a predetermined load. However, the user may control the aligning and mounting device 103 while observing the output voltage V from the detector 102 by a monitor.

Figure 8:
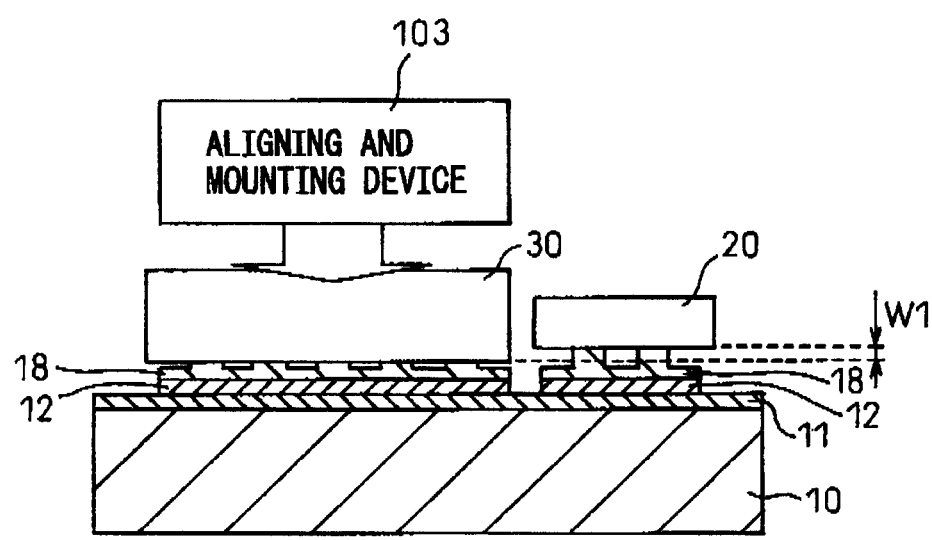
FIG. 8 is a diagram showing another example of the process of manufacturing the semiconductor laser module 1.

FIG. 8 is a diagram showing another example of the process of manufacturing the semiconductor laser module 1.

Figure 5B:
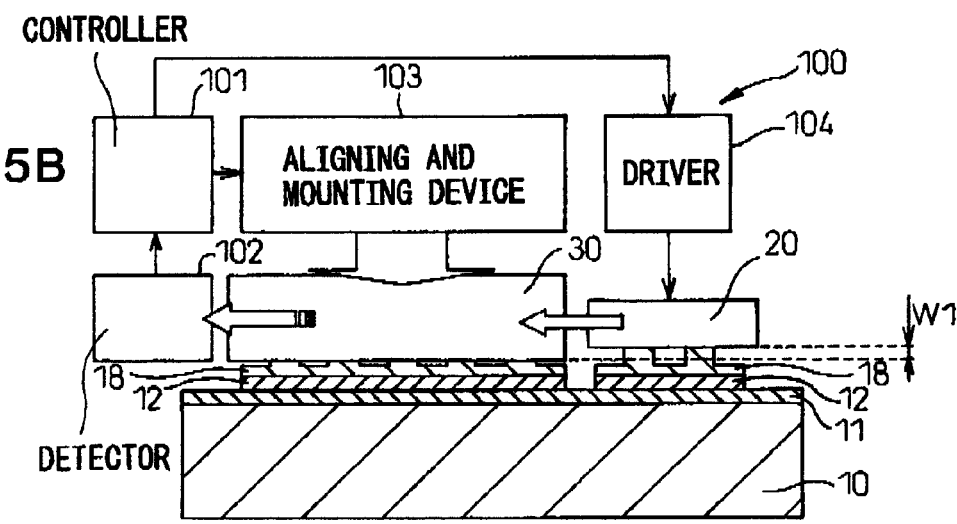
Figure 5C:
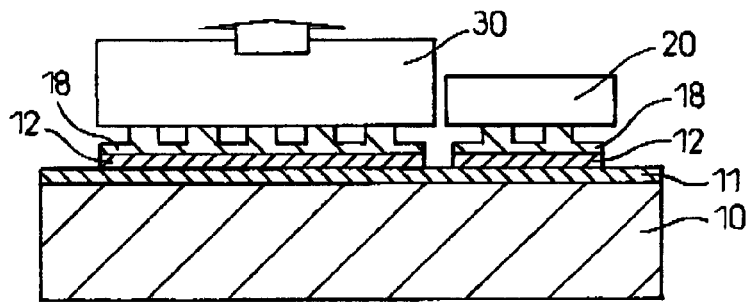

With reference to FIG. 8, the aligning and mounting of the another PPLN element 30 will be described. In the example of FIG. 5B (S18 in FIG. 2), after the output voltage V from the detector 102 becomes the maximum value, the controller 101 controls the aligning and mounting device 103 so as to apply a predetermined load. However, for the microbumps 18 and 19, the LD element 20, and the PPLN element 30 manufactured with a predetermined reference, it is not always necessary to make the LD element 20 emit light and individually perform the aligning and mounting according to the output voltage V from the detector 102.

In the example of FIG. 8, the load at which the output voltage V from the detector 102 becomes the maximum value (refer to the point D in FIG. 7) is predicted and, in addition to the load (for example, 400(N)), the above-described predetermined load amount (F: 200(N)) is applied (for example, 600 (N) in total). By the application, the incident position 31 of the PPLN element 30 is pushed into the position (refer to the position P3 in FIG. 6) which is further deeply pushed from the light emission center 21 of the LD element 20 only by the distance W1 shown in FIG. 6 and, after that, the load is released. The incident position 31 of the PPLN element 30 returns to the position where it is most-efficiently optically coupled to the light emission center 21 of the LD element 20 (refer to P2 in FIG. 6) by elastic return. That is, in the example of FIG. 8, using only the aligning and mounting device 103, without using the controller 101, the detector 102, and the driver 104 shown in FIG. 5B, the positional relation in the height direction (Z-axis direction) between the PPLN element 30 and the LD element 20 is set.

The method shown in FIG. 8 is different from the manufacturing process of the semiconductor laser module 1 illustrated in FIG. 2 only with respect to the point that only the aligning and mounting device 103 is used and the controller 101, the detector 102, and the driver 104 are not used in the aligning and mounting process (S18 in FIG. 2). Since the other points, particularly, the process of manufacturing the microbumps 18 and 19 and the method of bonding the LD element 20 and the PPLN element 30 and the microbumps 18 and 19 are the same, their description will not be repeated.

Figure 9A:
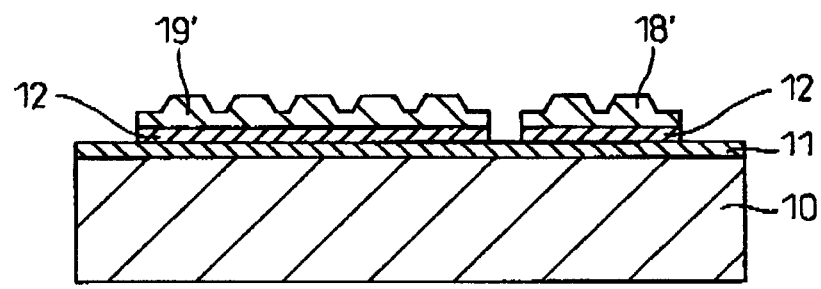
FIGS. 9A, 9B and 9C are diagrams for explaining other microbumps.
Figure 9B:
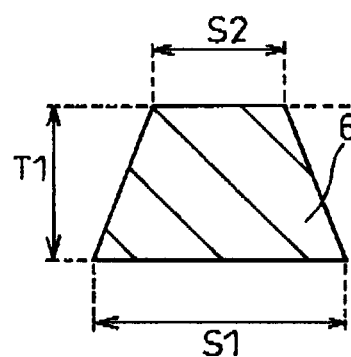
Figure 9C:
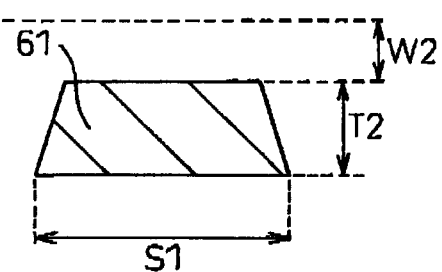

FIGS. 9A to 9C are diagrams for explaining other microbumps.

Figure 4C:
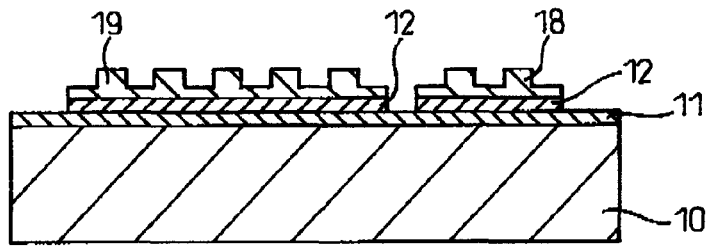

The microbumps 18 and 19 shown in FIGS. 4 and 5 include a plurality of projections each having a columnar shape and having a height of 2 μm and a diameter of 5 μm, which are disposed at pitches of 10 to 25 μm equally in the horizontal direction. Other microbumps 18' and 19' shown in FIG. 9A include a plurality of projections each having a truncated cone shape. FIG. 9A is a cross section of the microbumps 18' and 19' and others, and corresponds to FIG. 4C. FIG. 9B is a cross section of a projection part 60 included in the microbumps 18' and 19', and FIG. 9C is a diagram showing an example of a pressed projection part 61 included in the microbumps 18' and 19'.

As shown in FIG. 9B, in the truncated-cone-shaped projection part 60, the bottom face has a circular shape having a diameter S1 (for example, 2 μm), the top face has a circular shape having a diameter S2 (for example, 1 μm), and height is T1 (for example, 2 μm). The microbumps 18' and 19' include the projection parts 60 which are disposed at pitches of 2 μm and equally in the horizontal direction.

FIG. 9C shows an example of the projection part 61 which is pressed at the time of aligning and mounting the PPLN element 30. In the truncated-cone-shaped projection part 61, the bottom face has a circular shape having a diameter S1 (for example, 2 μm), and height is T2 (for example, 1 μm). In this case, therefore, the truncated-cone-shaped projection part is pressed only by distance W2 (for example, 1 μm) by the aligning and mounting.

The microbumps 18' and 19' each having the truncated cone shape of which top face is slightly smaller are pressed more easily as compared with the microbumps 18 and 19 each having a columnar shape shown in FIGS. 4B and 4C and FIGS. 5A to 5C in the case of applying the same load. There is consequently an effect that the control for alignment is easier (for the reason that the aligning and mounting device 103 does not have to apply a high load).

With reference to FIG. 10 and FIGS. 11A to 11C, another method of a part related to bonding of the LD element 20 and the PLLN element 30 in the processes of manufacturing the semiconductor laser module 1 as an example of the optical module will be described. FIG. 10 is a flowchart for explaining processes of the semiconductor laser module 2. FIGS. 11A to 11C are diagrams for explaining processes of manufacturing the semiconductor laser module 2 shown in FIG. 10 more specifically.

The difference between the semiconductor laser module 2 and the foregoing semiconductor laser module 1 is the point that, in the semiconductor laser module 2, the PPLN element 30 and the microbumps 19 are fixed by a thermosetting bonding resin. Therefore, the Au layer is not formed on the substrate on the microbumps side of the PPLN element 30. Since it is unnecessary to supply current to the PPLN element 30 in the semiconductor laser module 2, the MN element 30 is fixed on the microbumps 19 by a thermosetting bonding resin without using a high-cost Au layer. Except for this point, the semiconductor laser module 2 is similar to the semiconductor laser module 1. Accordingly, S20 to S25 and S27 in the processes of manufacturing the semiconductor laser module 2 shown in EXG. 10 are the same as S10 to S15 and S17 in the processes of manufacturing the semiconductor laser module 1 shown in FIG. 2, and their description will not be repeated.

In the processes of manufacturing the semiconductor laser module 2 shown in FIG. 10, the surface activation is performed by performing cleaning and/or a treatment using plasma only on the surface of the microbumps 18 in S26. The surface activating process may be performed also on the microbumps 19.

The LD element 20 is mounted in S27 like in S17 in FIG. 2 and, after that, a resin 70 for bonding is applied on the microbumps 19 (refer to FIG. 11A). As the resin 70 for bonding, a thermosetting resin, a UV curable resin, or the like for optical parts can be used.

Subsequently, the PPLN element 30 is aligned and mounted with heat on the resin 70 for bonding (S29) (refer to FIG. 11B). The aligning and mounting method in S29 is the same as that in S18 in FIG. 2 and in FIG. 5B. Therefore, the controller 101 preliminarily considers the elastic return amount of the microbumps 19 and, after the output voltage V from the detector 102 becomes the maximum value (refer to the point D), further applies a predetermined load amount (F: 200(N)) to the PPLN element 30. That is, the controller 101 further applies a predetermined load so that the incident position 31 of the PPLN element 30 is pushed in to a position which is further deeply pressed from the light emission center 21 of the LD element 20 only by the distance W3 shown in FIG. 11B. However, in the aligning and mounting with heat, heating is performed to harden the resin 70 for bonding in a state where the load is further applied.

When the load is released, the incident position 31 of the PPLN element 30 returns to the position where it most-efficiently optically couples to the light emission center 21 of the LD element 20 by elastic return (refer to FIG. 11C). After that, the series of processes are finished.

With reference to FIG. 10 and FIGS. 11A to 11C, bonding between the PPLN element 30 and the silicon substrate 10 using the resin 70 for bonding has been described. The LD element 20 and the silicon substrate 10 may be bonded by using the resin 70 for bonding. In the case where it is necessary to make the LD element 20 and the silicon substrate 10 conducted via the microbumps 18, it is sufficient to make the resin 70 for bonding penetrate the microbumps 18. Further, in the case where it is necessary to make the LD element 20 and the silicon substrate 10 conducted by an adhesive, it is sufficient to bond the LD element 20 and the silicon substrate 10 by using a conductive adhesive.

Also in the case of bonding the LD element 20 or the PPLN element 30 and the silicon substrate 10 by using an adhesive, as described with reference to FIG. 8, in the aligning and mounting process (S18 in FIG. 2), only the aligning and mounting device 103 may be used without using the controller 101, the detector 102, and the driver 104.

Figure 12:
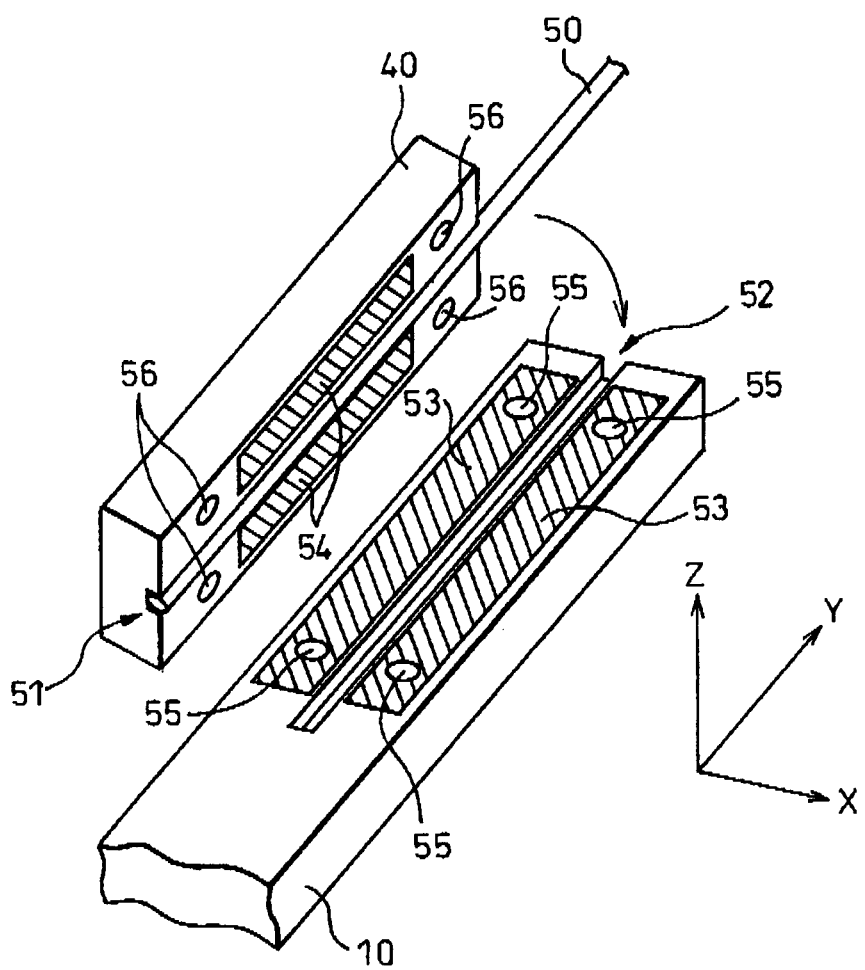
FIG. 12 is a diagram for explaining bonding between a substrate 10 and a sub-substrate 40.
Figure 13A:
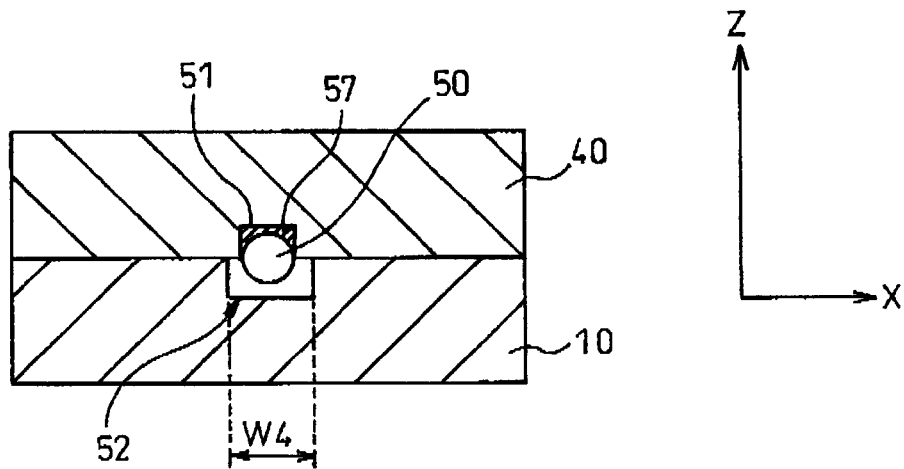
FIGS. 13A and 13B are diagrams illustrating the positional relationship between the PPLN element 30 and a fiber 50.
Figure 13B:
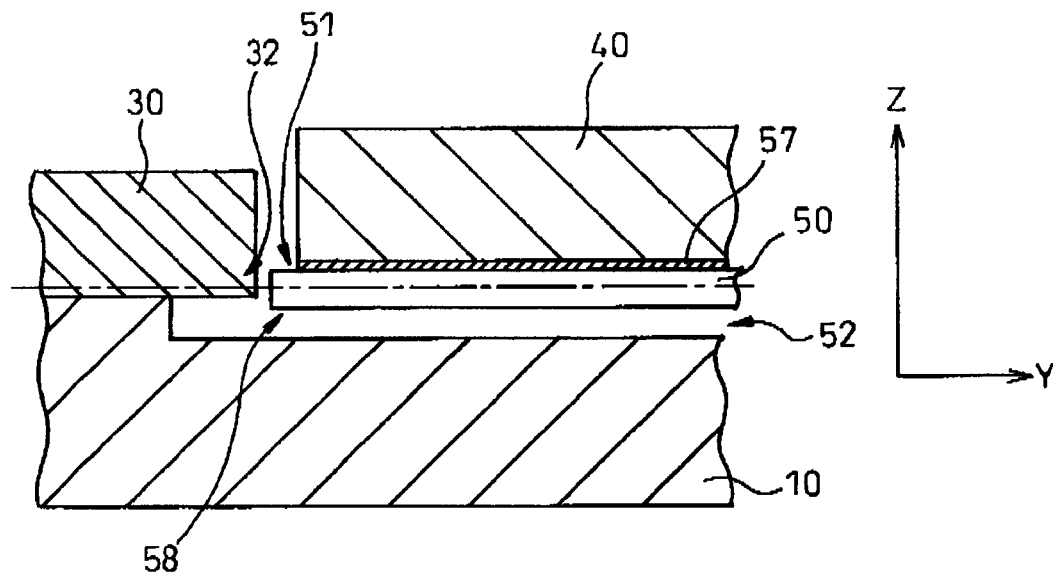

With reference to FIGS. 12 to 14, bonding of the sub-substrate 40, in the processes of manufacturing the semiconductor laser module 1 as an example of the optical module will be described. FIG. 12 is a diagram for explaining bonding between the substrate 10 and the sub-substrate 40. FIGS. 13A and 13B are diagrams illustrating the positional relationship between the PPLN element 30 and the fiber 50. FIG. 14 is a diagram for explaining aligning and mounting of the sub-substrate 40.

As shown in FIG. 12, a rectangular groove 51 is formed in the sub-substrate 40, and a front-end part 58 of the optical fiber 50 is fit in the rectangular groove 51 and fixed by an adhesive 57. It is also possible to form a V-shaped groove in place of the rectangular groove 51 in the sub-substrate 40 and fit and fix the front-end part 58 of the optical fiber 50 in the V-shaped groove. Metal thin films 54 and alignment marks 56 are provided in a bonding face of the sub-substrate 40. In parts corresponding to the sub-substrate 40 in the silicon substrate 10, a fiber escape groove 52, microbumps 53, and alignment marks 55 are provided.

The sub-substrate 40 is mounted on the silicon substrate 10 by the aligning and mounting device 103 as will be described later. When the sub-substrate 40 is mounted, positions are roughly determined by the alignment marks 55 and alignment marks 56. After that, while detecting an output from the optical fiber 50 by the detector 102, the positions in the X-axis direction, Y-axis direction, and Z-axis direction are determined in the submicron order, and the sub-substrate 40 is bonded on the silicon substrate 10. The microbumps 53 formed on the joint face of the sub-substrate 40 and the silicon substrate 10 are subjected to the plasma cleaning process so that the surface is activated and, after that, bonded by a load applied from the aligning and mounting device 103. The microbumps 53 made of gold formed on the silicon substrate 10 are formed on the silicon substrate 10 by a method similar to the above-described method of forming the microbumps 18 and 19.

FIG. 13A is a cross section taken along line B-B' in FIG. 1A. As illustrated in FIG. 13A, the optical fiber 50 fixed in the rectangular groove 51 in the sub-substrate 40 by an adhesive 57 can move in the fiber escape groove 52 provided in the silicon substrate 10 by moving sub-substrate 40 in the X-axis and Y-axis directions by the aligning and mounting device 103. That is, the position adjustment in the X-axis and Y-axis directions can be performed within the range of the width W4 of the fiber escape groove 52. In FIG. 13A, the microbumps 53 and the like are not shown.

FIG. 13B is a cross section taken along line C-C' in FIG. 1A. As shown in FIG. 13B, the front-end part 58 of the optical fiber 50 fixed in the sub-substrate 40 is optically coupled to the outgoing center 32 of the PPLN element 30 with high precision and receives a wavelength-converted green laser beam having a wavelength of 532 nm which is output from the outgoing center 32 of the PPLN element 30. The green laser beam having a wavelength of 532 nm received by the front-end part 58 of the optical fiber 50 propagates through the optical fiber 50. Although the microbumps 53 and so one are not shown in FIG. 13B, the alignment of the outgoing center 32 of the PPLN element and the front-end part 58 of the optical fiber 50 in the Z direction is controlled by the microbumps 53.

With reference to FIG. 14, aligning and mounting of the sub-substrate 40 will be described. The example of FIG. 5B (S18 in FIG. 2) relates to the aligning and mounting of the PPLN element 30. In FIG. 14, by a similar method, the sub-substrate 40 is aligned and mounted so that the outgoing center 32 of the PPLN element 30 and the front-end part 58 of the optical fiber 50 are optically coupled with high precision. It is assumed that, prior to the aligning and mounting of FIG. 14, the surface of the metal thin film 54 on the joint face side of the sub-substrate 40 and the microbumps 53 on the silicon substrate 10 are subjected to the plasma cleaning process.

The aligning and mounting in FIG. 14 is performed by using the aligning and mounting device 100 in a manner similar to the case of FIG. 5B. The controller 101 controls the driver 104 to drive the LD element 20 and make the laser beam enter the PPLN element 30, and the intensity of a laser beam emitted from the PPLN element 30 and transmitted through the optical fiber 50 is detected by the detector 102.

First, the controller 101 controls the aligning and mounting device 103 while monitoring the output voltage V detected by the detector 102 and, while moving the sub-substrate 40 in the X-axis and Y-axis directions, determines the position where the output voltage V is the highest (first stage). As described above, since the optical fiber 50 can move in the range of the width W4 in the optical fiber escape groove 52, the aligning and mounting device 103 moves the sub-substrate 40 in the X-axis and Y-axis directions in this range.

Next, the controller 101 controls the aligning and mounting device 103 and disposes the sub-substrate 40 on the microbumps 53 in the position where the output voltage V is the highest in the first stage.

While monitoring the output voltage V detected by the detector 102, the controller 101 controls the aligning and mounting device 103 to control the load applied to the sub-substrate 40 and to position the sub-substrate 40 in the Z-axis direction (second stage). After the output voltage V from the detector 102 becomes the maximum value, the controller 101 further applies a predetermined load amount and, then, releases the load. A predetermined load is further applied so that the front-end part 58 of the optical fiber 50 fixed in the sub-substrate 40 is in the position which is further deeply pressed from the outgoing center 32 of the PPLN element 30 only by predetermined distance. After that, by releasing the load, the front-end part 58 of the optical fiber 50 fixed to the sub-substrate 40 returns to the position where it is optically coupled to the outgoing center 32 of the PPLN element 30 most efficiently by elastic return. The above point is based on the theory similar to the aligning and mounting for optically coupling the PPLN element 30 and the LD element 20 described with reference to FIGS. 5A to 5C to FIG. 7. As described above, the sub-substrate 40 is positioned in the X-axis and Y-axis directions in the first stage and is positioned in the z-axis direction in the second stage.

In the method of bonding the sub-substrate 40 described with reference to FIGS. 12 to 14, as explained with reference to FIG. 8, only application of a predetermined load may be performed using only the aligning and mounting device 103 without using the controller 101, the detector 102, and the driver 104 in the aligning and mounting process (FIG. 14). In the method of bonding the sub-substrate 40 described with reference to FIGS. 12 to 14, the sub-substrate 40 may be bonded to the silicon substrate 10 by using microbumps similar to the different microbumps 18' and 19' shown in FIG. 9. In the method of bonding the sub-substrate 40 described with reference to FIGS. 12 to 14, as explained with reference to FIG. 10 and FIGS. 11A to 11C, the sub-substrate 40 may be bonded to the silicon substrate 10 by using an adhesive.

In the foregoing embodiment, as examples of the bonding bumps, the microbumps 18, 19, and 53 each having a cylindrical projection and made of Au (refer to FIG. 4C) and the microbumps 18' and 19' each having a truncated cone shape and made of Au (refer to FIG. 9) have been described. Other bonding bumps may be used as long as they are made of metal and have a shape formed with high precision. The conditions requested for the bonding bumps are that bumps have a material and a shape by which a deformation amount in the case of applying a predetermined load and an elastic return amount in the case of releasing a predetermined load which is applied are always almost constant.

In the above example, in the optical module 1, the sub-substrate 40 to which the LD element 20, the PPLN element 30, and the optical fiber 50 are fixed is bonded to the silicon substrate 10 by surface-activation bonding using the microbumps. Alternately, the sub-substrate 40 to which only the LD element 20 and the PPLN element 30 or the PPLN element 30 and the optical fiber 50 are fixed may be bonded to the silicon substrate 10 by surface-activation bonding using the microbumps so that optical coupling is carried out excellently.

What is claimed is:

1. A method of manufacturing an optical module including a first optical device and a second optical device bonded on a substrate, comprising the steps of:
    forming bonding bumps made of metal on the substrate;
    bonding the first optical device on the substrate; and
    bonding the second optical device on the substrate through the bonding bumps,
    wherein the step of bonding the second optical device comprise the steps of:
        detecting a first load where the first optical device and the second optical device are optically coupled most efficiently by using a photodetector for detecting light emitted from the first optical device via the second optical device while increasing a load applied to the second optical device;
        obtaining a second load which is larger than the first load and causes the second optical device to a first position where the first optical device and the second optical device are optically coupled most efficiently after releasing said second load in accordance with the result of the detection; and
        applying the second load to the second optical device. and
    wherein the bonding bumps are made of Au, and said second optical device goes to a second position which is lower than said first position by applying said second load and returns up to said first position after releasing said second load.

2. The method of manufacturing an optical module according to claim 1, wherein the second optical device is bonded on the substrate through the bonding bumps by surface activated bonding.

3. The method of manufacturing an optical module according to claim 1, wherein the second optical device is bonded on the substrate by an adhesive.

4. The method of manufacturing an optical module according to claim 1, wherein the bonding bumps include a plurality of projections.

* * * * *

UNITED STATES PATENT AND TRADEMARK OFFICE
CERTIFICATE OF CORRECTION

| | | |
|---|---|---|
| PATENT NO. | : 9,214,446 B2 | Page 1 of 1 |
| APPLICATION NO. | : 13/422656 | |
| DATED | : December 15, 2015 | |
| INVENTOR(S) | : Kaoru Yoda | |

It is certified that error appears in the above-identified patent and that said Letters Patent is hereby corrected as shown below:

In the claims

Claim 1, Col. 11, line 24, "comprise" should read --comprises--.

Claim 1, Col. 12, lines 10-11, "device. and" should read --device, and--.

Signed and Sealed this
Nineteenth Day of July, 2016

Michelle K. Lee
*Director of the United States Patent and Trademark Office*